(12) United States Patent
Darmawikarta et al.

(10) Patent No.: US 11,908,821 B2
(45) Date of Patent: Feb. 20, 2024

(54) SACRIFICIAL DIELECTRIC FOR LITHOGRAPHIC VIA FORMATION TO ENABLE VIA SCALING IN HIGH DENSITY INTERCONNECT PACKAGING

(71) Applicant: Intel Corporation, Santa Clara, CA (US)

(72) Inventors: Kristof Darmawikarta, Chandler, AZ (US); Sri Ranga Sai Boyapati, Chandler, AZ (US); Hiroki Tanaka, Chandler, AZ (US); Robert A. May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/563,995

(22) Filed: Dec. 28, 2021

(65) Prior Publication Data

US 2022/0122935 A1    Apr. 21, 2022

Related U.S. Application Data

(62) Division of application No. 15/857,332, filed on Dec. 28, 2017, now Pat. No. 11,264,346.

(51) Int. Cl.
*H01L 21/48* (2006.01)
*H01L 23/538* (2006.01)
(Continued)

(52) U.S. Cl.
CPC ............ *H01L 24/19* (2013.01); *H01L 21/481* (2013.01); *H01L 21/4853* (2013.01); *H01L 23/49827* (2013.01); *H01L 23/49838* (2013.01); *H01L 23/49866* (2013.01); *H01L 23/5381* (2013.01); *H01L 23/5386* (2013.01); *H01L 24/20* (2013.01); *H01L 2224/18* (2013.01)

(58) Field of Classification Search
CPC ............... H01L 21/481; H01L 21/4853; H01L 23/49827; H01L 23/49838; H01L 23/5381; H01L 23/5386; H01L 24/20; H01L 2224/18; H01L 24/13; H01L 24/16; H01L 2224/16225; H01L 24/19; H01L 2924/14

See application file for complete search history.

(56) References Cited

U.S. PATENT DOCUMENTS 9,972,589 B1 * 5/2018 Goh .................. H01L 23/528
2006/0166402 A1 * 7/2006 Lim ................... H01L 24/12
257/E23.021

(Continued)

OTHER PUBLICATIONS

Notice of Allowance for U.S. Appl. No. 15/857,332, dated Sep. 29, 2021.

(Continued)

*Primary Examiner* — Thanh Y. Tran
(74) *Attorney, Agent, or Firm* — Essential Patents Group, LLP

(57) ABSTRACT

An apparatus, comprising a substrate comprising a dielectric, a conductor, comprising a via embedded within the dielectric, the via has a first end and a second end, and substantially vertical sidewalls between the first end and the second end, and a conductive structure extending laterally from the first end of the via over the dielectric, wherein the via and the conductive structure have a contiguous microstructure.

19 Claims, 9 Drawing Sheets

(51) Int. Cl.
    *H01L 23/498*     (2006.01)
    *H01L 23/00*     (2006.01)

(56) References Cited

U.S. PATENT DOCUMENTS

| | | |
|---|---|---|
| 2016/0118355 A1 | 4/2016 | Lin et al. |
| 2018/0151527 A1 | 5/2018 | Chang et al. |
| 2018/0308891 A1 | 10/2018 | Wakiyama et al. |
| 2019/0043802 A1* | 2/2019 | Kapusta .............. H01L 21/4857 |
| 2019/0096834 A1 | 3/2019 | Bih et al. |
| 2019/0148329 A1* | 5/2019 | Ting ................... H01L 21/561 |
| | | 257/774 |
| 2019/0189508 A1* | 6/2019 | Peethala ........... H01L 21/76856 |

OTHER PUBLICATIONS

Office Action for U.S. Appl. No. 15/857,332, dated Jun. 9, 2021.
Restriction Requirement for U.S. Appl. No. 15/857,332, dated Mar. 10, 2021.

\* cited by examiner

SACRIFICIAL DIELECTRIC FOR LITHOGRAPHIC VIA FORMATION TO ENABLE VIA SCALING IN HIGH DENSITY INTERCONNECT PACKAGING

CLAIM FOR PRIORITY

This application is a divisional of, and claims the benefit of priority to U.S. patent application Ser. No. 15/857,332, filed on Dec. 28, 2017, titled "SACRIFICIAL DIELECTRIC FOR LITHOGRAPHIC VIA FORMATION TO ENABLE VIA SCALING IN HIGH DENSITY INTERCONNECT PACKAGING", and which is incorporated by reference in its entirety for all purposes.

BACKGROUND

Current trends in microelectronic package architecture are increasingly focused on high-density interconnect fabrication in order to accommodate demands for package size miniaturization and heterogeneous integration. Such high-density architectures require increasingly smaller traces and via pads. In both single substrate and three dimensional (3D) microelectronic package architectures, vias provide inter-level connectivity. Vias are conductive pillars that extend through the dielectric material of a planar substrate to interconnect metallization layers. Current fabrication methods for forming vias in package substrates are limited in both scalability and range of suitable dielectric materials. To further scale via size in relation to target interconnect pitch, a breakthrough in package via fabrication is needed.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
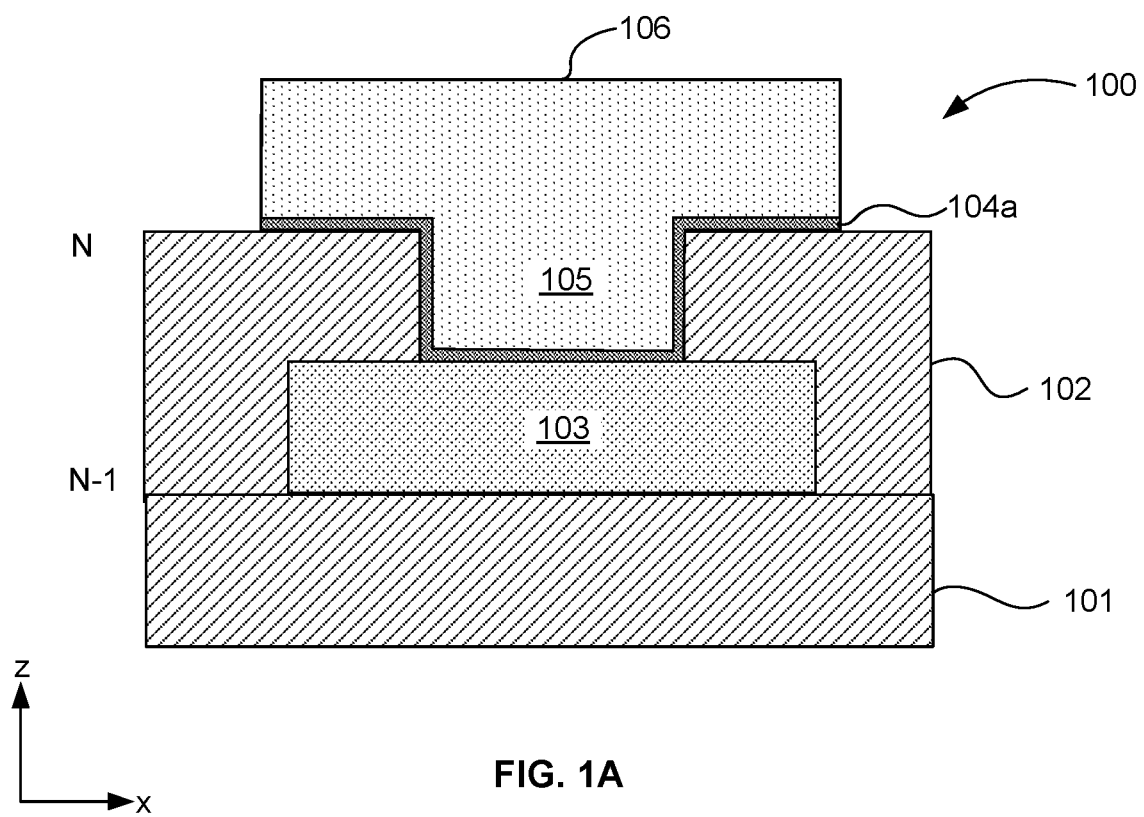
FIG. 1A illustrates a cross-sectional view of a first embodiment of a substrate having a metallization structure comprising a via and overlying bond pad formed by the described method, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

In current microelectronic package assembly processes, metallization layers are formed on package substrate surfaces, and are lithographically patterned into conductive traces and bond pads. Typically, one or more integrated circuit (IC)-carrying semiconductor dies (IC dies) are bonded to the package substrate, which provides interconnects between the dies and external pins or bond pads on the package body. In some packages, multiple dies are distributed horizontally or vertically stacked.

The package substrate supports signal and power routing circuitry in the form of signal and power bond pads and traces over the substrate surface. In most package fabrication processes, the bond pads and traces are lithographically patterned in metal layers on one or both sides of the substrate surface. In many package architectures, IC dies are solder bonded to bond pads on one side of the package substrate, and external bond pads are located on the opposite side of the package substrate. The external bond pads may be bumped, where solder balls are attached to the external bond pads for bonding to a printed circuit board, as an example. In a similar way, the IC die itself may be bumped with solder balls, to facilitate integration of the chip into the IC package. For example, a ball grid array (BGA) may be formed on one side of the IC die in preparation for flip-chip (C4) bonding of the IC die to the package substrate.

In order to accommodate increasingly higher BGA density of current and future IC dies, the package substrate bond pad size and pitch must shrink. This requires that via pitch in the package substrate must continually decrease. Current via fabrication methods include laser drilling into substrate dielectric to form cavities into which metal may be plated, producing micro-vias. However, this method may be limited in the extent that it can scale to smaller via diameter and pitch. In most cases, laser drilling is followed by a desmear operation, where ablation debris is removed by an etch step. This tends to enlarge the hole bored by the laser beam. In addition, the current resolution of laser-drilling is approximately 50 microns, and is dependent on the material being drilled. As the industry is moving toward a sub-30 micron bond pad pitch, bond pads of smaller diameter are required, and underpinning via diameters are required to be smaller yet to comply with design rules.

An alternative method to laser drilling is the use of lithographic techniques to define vias on a finer scale. This method uses a photoresist, typically a dry film resist that is laminated over copper features, such as bond pads, in a first metal layer made on a substrate carrier or a substrate dielectric layer. The photoresist film is patterned to form openings over the copper features. Copper is electroplated into the openings, forming pillars. The photoresist is then stripped, leaving the copper pillar. Subsequently, a layer of dielectric build-up film is laminated over the pillar, then planarized to reveal the top of the pillar. A second metal layer may then be formed over the pillar, which now serves as a via interconnect.

While providing advantages over laser drilling, electroplating into the lithographically defined holes presents a problem of current density distribution. Typically, the areal density of via holes is 5-10% of the total substrate surface, a very low areal ratio for obtaining uniform thicknesses in electroplated structures across the substrate. In addition, during electroplating, the current density in the pinhole openings is generally high and mass-transfer limited. As electrolyte concentration gradients exist in the z-direction as well as the x and y-directions, thickness variations in electroplated vias may result in incomplete filling of via holes and marginal to non-existent connections to surface metallization.

A further alternative method to laser drilling is the use of photo-imageable dielectric (PID) film, replacing non-photosensitive dielectric materials mostly used in microelectronic packaging. While via scaling is possible using lithographic techniques to accommodate high-density interconnect packaging, the PID film remains permanently as the package substrate dielectric material. PID films that are currently in use have been shown to have mechanical and electrical properties that are inferior to those of standard epoxy materials.

A method for forming scalable vias in a microelectronic package substrate that overcomes the afore-mentioned limitations is herein disclosed. Embodiments of microelectronic packages fabricated according to the herein described method are also disclosed. The disclosed method comprises the use of a sacrificial photosensitive dielectric film to form via cavities in a non-photosensitive substrate dielectric material, such as an epoxy-based dielectric build-up film laminate. According to some embodiments, the sacrificial photosensitive film is lithographically patterned, then the patterned features are overlaid and encapsulated by a non-photosensitive dielectric material. The disclosed method further comprises opening the overlaying dielectric material to expose the encapsulated sacrificial film. Accordingly, the encapsulated features are sacrificial molds that are subsequently dissolved to produce open cavities in the substrate dielectric. Thus, the sacrificial molds that are a result of a patterned photoresist layer serve as a template for via formation within a dielectric layer.

Following the cavity opening, a seed layer comprising a thin film of one or more suitable metals such as copper and titanium, may be deposited over the substrate dielectric. The seed layer covers the surface of the dielectric, according to some embodiments. In some embodiments, the seed layer covers portions of the sidewalls of the open cavities. According to some embodiments, a seed layer is not formed in the open cavities.

According to some embodiments, the seed layer is patterned to form feature outlines over which copper or other suitable metal is to be electroplated to form a metallization layer. In some embodiments, a single electroplating step is executed to fill the open cavities and form the metallization layer. In contrast, lithographically defined vias are grown first by electroplating directly into photoresist cavities, forming pillars. The cavities in the photoresist are typically approximately 200 microns or less in diameter. Underlying metallization exposed in the via holes act as pinhole microelectrodes for electroplating. Via hole areal density is typically low, ranging between 5% to 10% of the substrate area. Under such conditions, plating rates are limited by mass transport of copper or other metal ions into the via holes. The resulting electroplated vias may not completely fill the holes in some portions of the substrate, posing a problem for subsequent steps in the process. Thus, via tops may not be exposed after the dielectric etch or planarization step necessary to reveal the buried vias.

Still referring to lithographically defined via formation, the photoresist is stripped subsequent to via plating. A new layer of dielectric film (e.g., build-up film) is laminated over the newly formed pillars, which are the lithographically defined vias. The dielectric film must be etched or planarized to reveal the tops of the lithographically defined vias, and a second electroplating step is required to form a second metallization layer coupled to the vias. The revealed lithographically defined vias serve as electrodes to initialize the formation of the second metallization layer. However, some vias are not exposed after the dielectric etch or planarization step to reveal the buried vias due to plating non-uniformities mentioned earlier. These plating non-uniformities are the result of the low areal density of the via holes, which are effectively pinhole electrodes, and their associated mass transfer-limited plating currents.

Because the vias and second metallization layer are formed in a single deposition step in the present method of the disclosure, the areal density of plating is drastically increased. Plating of vias within the dielectric layer openings occurs first, followed by formation of the second metallization layer as the via reaches and exceeds the top of the dielectric layer and spreads laterally, immediately contacting the metal seed layer adjacent to the via hole. In some embodiments, the metal seed layer is electrified and serves as a large area cathode. As the metallization layer spreads laterally, the plating increases at a rapid rate. As a result, plating thickness has a substantially higher degree of uniformity across the substrate surface.

As a consequence of the single plating step, the via and overlying metallization are metallurgically a contiguous structure. In some embodiments, metal grains within the via structure extend into a contiguous metallization feature. In such a contiguous structure, no boundary is visible at the interface between the via and the overlying metal feature, as may be seen in a metallographic cross-section image. In contrast, where two electroplating steps are required first forming the via, a demarcation line is visible (e.g., when viewed in a metallographic image) at the interface where the via abuts the overlying metallization feature.

The sidewalls of the cavities produced by the disclosed method are substantially vertical, in contrast to laser drilled via holes, which are mostly tapered. Via holes made by PID or by photoresist films may also be vertical. However, two resist stripping steps are required in methods for lithographic definition of vias. Resist stripping chemicals also attack copper, requiring lithographic bias to compensate for the unwanted etching of copper features. In the disclosed method, the copper features are exposed to resist stripping chemicals only one time according to some embodiments, saving the copper features from excessive etching.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/− 10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1A illustrates a cross-sectional view of a first embodiment of substrate 100 having a metallization structure comprising a via and overlying bond pad formed by the described method, according to some embodiments of the disclosure.

In FIG. 1A, substrate 100 comprises dielectric 101, in the form of a dielectric layer (or structure) that underlies dielectric 102. In some embodiments, dielectric 101 and dielectric 102 comprise the same dielectric material. In some embodiments, the dielectric material of dielectric 101 and dielectric 102 comprises a non-photosensitive epoxy resin, lacking photosensitizer compounds to render the material susceptible to photoinitiated cross linking or decomposition reactions.

Metallization structure 103 is partially encapsulated by dielectric 102. In some embodiments, metallization structure is part of an interior conductive layer of substrate 100 (e.g., level N−1, where 'N' is an integer). In some embodiments, metallization structure is a bond pad. In some embodiments, metallization structure is a signal or power trace. In some embodiments, metallization structure 103 comprises a metal such as, but not limited to, copper, aluminum or silver.

Seed layer (or structure) 104a overlies metallization structure 103. In some embodiments, seed layer 104a comprises a vertical portion that rises from metallization structure 103 to the top of dielectric 102. In some embodiments, seed layer 104a comprises an upper portion that extends laterally over the top of dielectric 102, as a layer contiguous with the vertical portion. In some embodiments, seed layer 104a comprises a metal such as, but not limited to, copper, titanium, tungsten, gold, or silver. In some embodiments, seed layer 104a has a thickness of 100 nm or less.

Via 105 overlays metallization structure 103. In some embodiments, seed layer 104a intervenes between metallization structure 103 and via 105. In some embodiments, via 105 comprises a metal such as, but not limited to, copper, aluminum, gold and silver. In some embodiments, via 105 has a circular cross section. In some embodiments, via 105 has a non-circular cross-section. In some embodiments, via 105 has a z-height ranging from 100 nm to 50 microns. In some embodiments, the sidewall of via 105 is substantially vertical.

Second metallization structure 106 overlays via 105. In some embodiments, second metallization structure 106 is a bond pad. In some embodiments, second metallization structure 106 is a conductive trace. In some embodiments, second metallization structure 106 comprises a metal such as, but not limited to, copper, aluminum, gold or silver. In some embodiments, second metallization structure extends laterally over the upper portion of seed layer 104a extending over dielectric 102. In some embodiments, second metallization structure 106 is a part of a top-level conductive layer (e.g., level N) at the surface of dielectric 102.

Figure 1B:
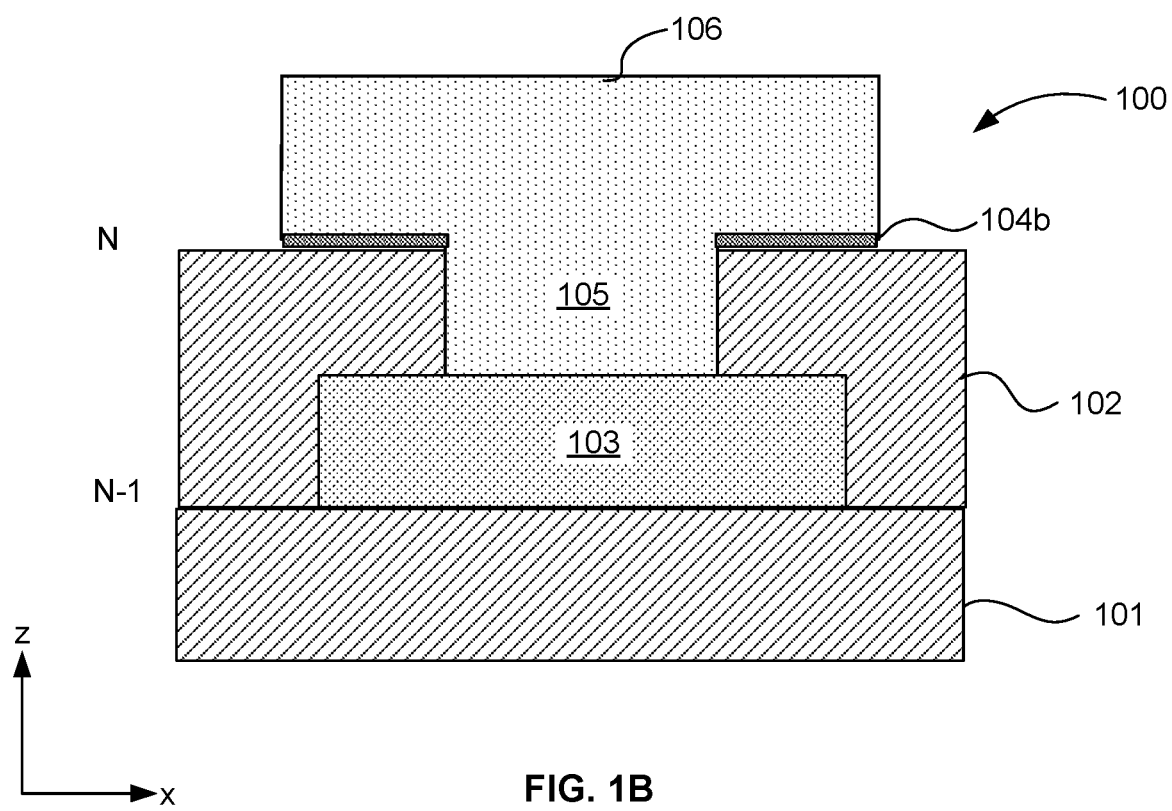
FIG. 1B illustrates a cross-sectional view of a second embodiment of a substrate having a metallization structure comprising a via and overlying bond pad formed by the described method, according to some embodiments of the disclosure.

FIG. 1B illustrates a cross-sectional view of a second embodiment of substrate 100 having a metallization structure comprising a via and overlying bond pad formed by the described method, according to some embodiments of the disclosure.

In FIG. 1B, substrate 100 comprises dielectric 101, in the form of a dielectric layer that underlies dielectric 102. In some embodiments, dielectric 101 and dielectric 102 comprise the same dielectric material. In some embodiments, the dielectric material of dielectric 101 and dielectric 102 comprises a non-photosensitive epoxy resin, lacking photosensitizer compounds to render the material susceptible to photoinitiated cross linking or decomposition reactions.

First metallization structure 103 is partially encapsulated by dielectric 102. In some embodiments, metallization structure is part of an interior conductive layer of substrate 100 (e.g., level N−1). In some embodiments, first metallization structure 103 is a bond pad. In some embodiments, metallization structure is a signal or power trace. In some embodiments, first metallization structure 103 comprises a metal such as, but not limited to, copper, aluminum or silver.

Seed layer 104b overlies first metallization structure 103. In some embodiments, seed layer 104b extends laterally over the top of dielectric 102. In some embodiments, seed layer 104b comprises a metal such as, but not limited to, copper, titanium, tungsten, gold, or silver. In some embodiments, seed layer 104b has a thickness of 100 nm or less.

Via 105 overlays first metallization structure 103. In some embodiments, via 105 comprises a metal such as, but not limited to, copper, aluminum, gold and silver. In some embodiments, via 105 has a circular cross section. In some embodiments, via 105 has a non-circular cross-section. In some embodiments, via 105 has a z-height ranging from 100 nm to 50 microns. In some embodiments, the sidewall of via 105 is substantially vertical.

Second metallization structure 106 overlays via 105. In some embodiments, second metallization structure 106 is a bond pad. In some embodiments, second metallization structure 106 is a conductive trace. In some embodiments, second metallization structure 106 comprises a metal such as, but not limited to, copper, aluminum, gold or silver. In some embodiments, second metallization structure extends laterally over the upper portion of seed layer 104b extending over dielectric 102. In some embodiments, second metallization structure 106 is a part of a top-level conductive layer (e.g., level N) at the surface of dielectric 102.

Figure 2:
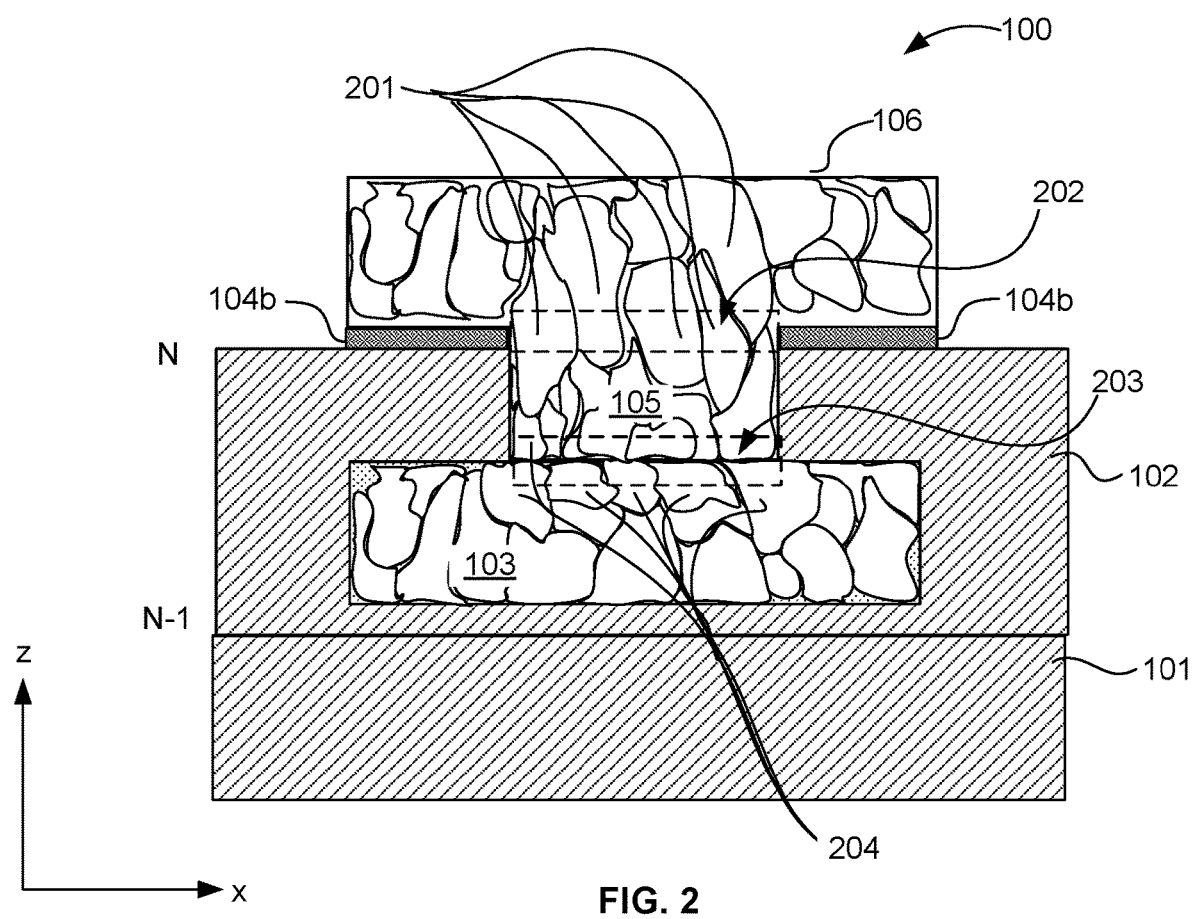
FIG. 2 illustrates a cross-sectional view of a substrate comprising a via and overlying bond pad formed by the described method. An exemplary internal metallurgical structure of the via and bond pad is shown, according to some embodiments of the disclosure.

FIG. 2 illustrates a cross-sectional view of substrate 100 comprising a via and overlying bond pad formed by the described method. An exemplary internal metallurgical structure of the via and bond pad is shown, according to some embodiments of the disclosure.

In some embodiments, via 105 and metallization structure 106 are metallurgically contiguous. This is illustrated in FIG. 2, showing an exemplary internal grain distribution of the combined structure comprising via 105, first metallization structure 103 and second metallization structure 106. In the illustrated example, metal grains 201 do not stop abruptly at boundary region 202 (delineated by dashed lines) between via 105 and metallization structure 106, and extend through boundary region 202. In the illustrated example of FIG. 2, metal grains 201 extend longitudinally between via 105 and overlying second metallization structure 106. In contrast, an example of an abrupt metallurgical demarcation between structurally contiguous structures is also shown in FIG. 2. Metal grains 204 do not extend across boundary region 203 between first metallization structure 103 and via 105.

Grain growth during formation of via 105, first metallization structure 103 and second metallization structure 106 is dependent on the method of formation, which is discussed in detail below. Briefly, the structures are formed by electrodeposition, according to some embodiments. First metallization structure is formed in a first electrodeposition step. Via 105 is formed over first metallization structure 103 in a separate electrodeposition step. Second metallization structure 106 and via 105 are formed in the same electrodeposition step. While first metallization structure 103 and via 105 are structurally contiguous, these structures are not metallurgically contiguous, as defined by metal grain growth patterns. The interfacial region (203) between first metallization structure 103 and via 105 may be characterized by a sharp growth demarcation defined by abutting grain boundaries between metal grains 203, and metal grains 204 confined to first metallization structure 103.

Figure 3:
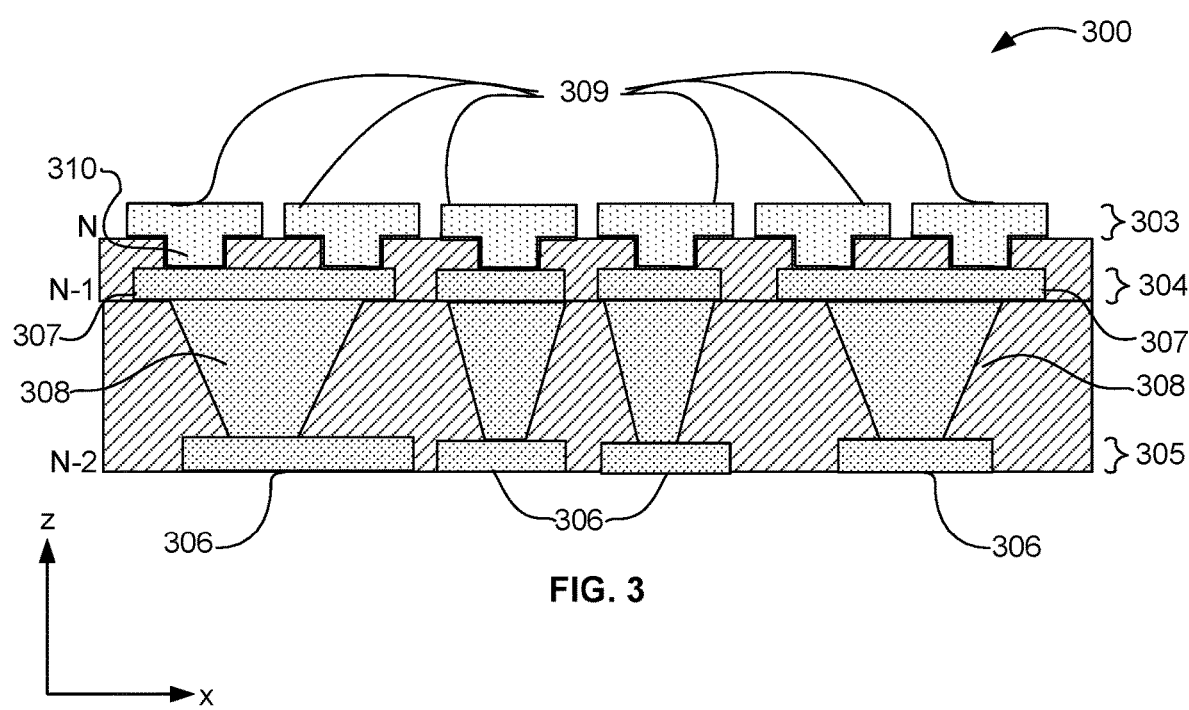
FIG. 3 illustrates a cross-sectional view of a substrate comprising multiple conductive layers and an array of metallization structures comprising a via and overlying bond pad formed by the described method, according to some embodiments of the disclosure.

FIG. 3 illustrates a cross-sectional view of substrate 300 comprising multiple conductive layers and an array of metallization structures comprising a via and overlying bond pad formed by the described method, according to some embodiments of the disclosure.

In FIG. 3, substrate 300 is an example of a vertically integrated package substrate having an array of high density via interconnects. Substrate 300 comprises dielectric layers 301 and 302. Conductive layers 303, 304 and 305 are vertically integrated at levels N, N−1 and N−2. Conductive layers 304-305 comprise metallization structures, such as bond pads 306 and buried traces 307, interconnected by vias 308. An array of high density interconnects located at level N comprise bond pads 309 in conductive layer 303, interconnected to conductive layer 304 by integral vias 310.

In some embodiments, the high density via interconnect array in conductive layer 303 accommodates bond pad pitches of less than 30 microns. Conductive layer 304 may comprise metallization structures such as traces 307 that are on the same scale as bond pads 309. In the illustrated example of FIG. 3, vias 308 are substantially larger than vias 310. Vias 308 may route power to traces 307 in conductive layer 304. In some embodiments, power is distributed to bond pads 309 through via interconnects 310. In some embodiments, bond pads 309 may have dimensions of 20 microns or less, for example, to accommodate a flip-chip die having a high density ball grid array for flip-chip die assembly.

Figure 4:
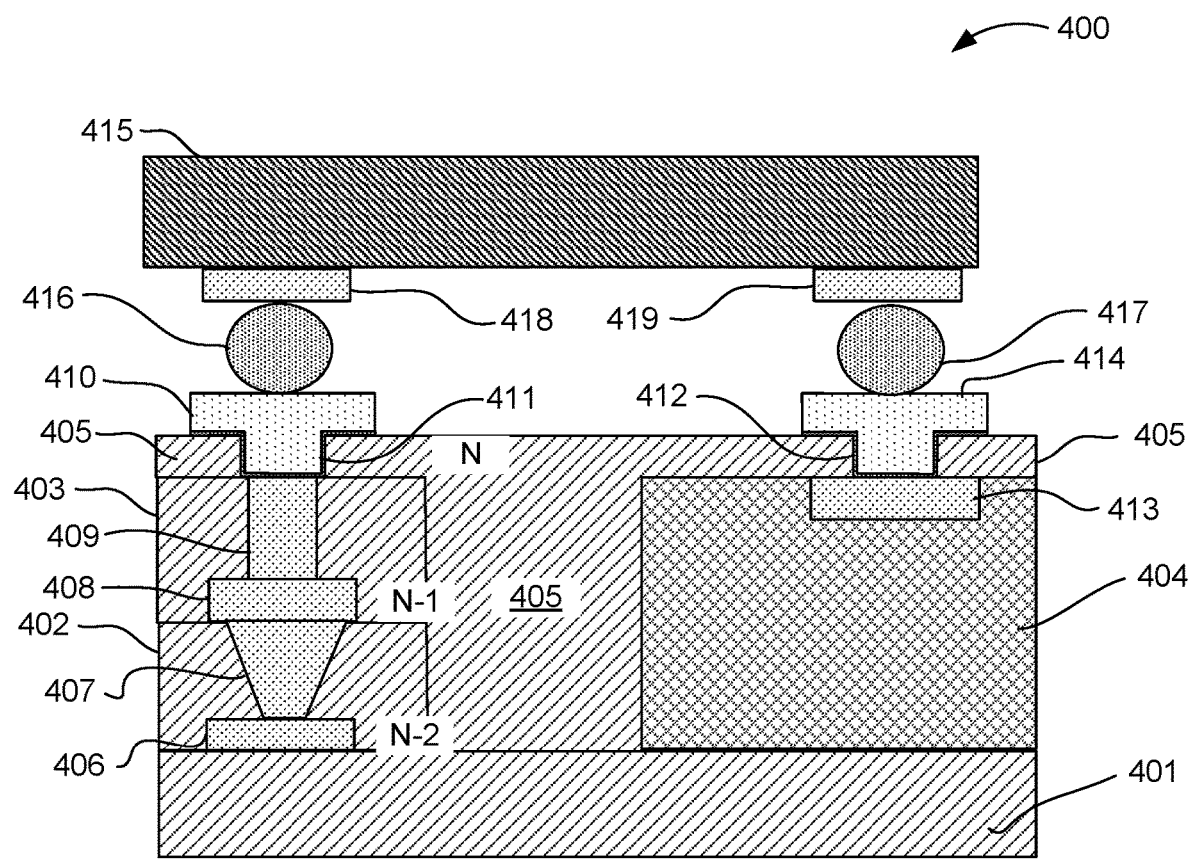
FIG. 4 illustrates a cross-sectional view of a vertically integrated package substrate having an embedded multichip bridge interconnect (EMIB) and an integrated circuit (IC) die coupled to the EMIB through a via and bond pad formed according to the described method, according to some embodiments of the disclosure.

FIG. 4 illustrates a cross-sectional view of vertically integrated package substrate 400 having an embedded multichip bridge interconnect (EMIB) and IC die coupled to the EMIB through a via and bond pad formed according to the described method, according to some embodiments of the disclosure.

In FIG. 4, package substrate 400 comprises dielectric layer 401. In some embodiments, first dielectric layer 401 is a build-up film laminate. In some embodiments, dielectric layer 401 is at the base of package substrate 400. In some embodiments, first dielectric layer 401 is within package substrate 400. First dielectric layer 401 is partially overlaid by second dielectric layer 402. In some embodiments, third dielectric layer 403 overlays second dielectric layer 402. In some embodiments, embedded multichip bridge interconnect (EMIB) 404 is encapsulated within package substrate 400, embedded within fourth dielectric layer 405. In some embodiments, first dielectric layer 401, second dielectric layer 402, third dielectric layer 403 and fourth dielectric layer 405 comprise the same material. In some embodiments, first, second, third and fourth dielectric layers 401, 402, 403 and 405, respectively, comprise an epoxy resin.

Vertically integrated metallization layers comprise first metallization structure 406, interconnected to second metallization structure 408 through via 407. In some embodiments, first metallization structure 406 and second metallization structure 408 are metal traces. Via 409 interconnects lower metallization structures 406 and 408 to top level (e.g., level N) bond pad 410 though integral via 411.

Integral via 412 interconnects bond pad 413 on EMIB 404 to top level bond pad 414. In some embodiments, integral vias 411 and 412 have straight sidewalls. In some embodiments, top level bond pads 410 and 414 are part of a high-density bond pad array extending into and out of the plane of the figure (y-dimension, not shown). For example, the center-to-center pitch of the high-density bond pad array may be less than 30 microns. In the illustrated embodiment, IC die 415 is solder-bonded to top level bond pads 410 and 414 by solder bumps 416 and 417, respectively. In some embodiments, IC die 415 is imbued with a high-density bond pad array 418 and 419.

In some embodiments, EMIB 404 carries a high-density array of bond pads 413 for accommodating the compact bond pad pitches on some IC dies. Corresponding arrays of bond pads 410 and 414 on package substrate 400 that are fabricated according to the method embodiments described below comprise bond pad dimensions and center-to-center pitches that match bond pad arrays on high-density IC dies.

FIGS. 5A-5H illustrate cross-sectional views of an embodiment of the method for fabrication of package substrate 100 having high-density interconnect bond pads and integral vias, according to some embodiments of the disclosure.

Figure 5A:
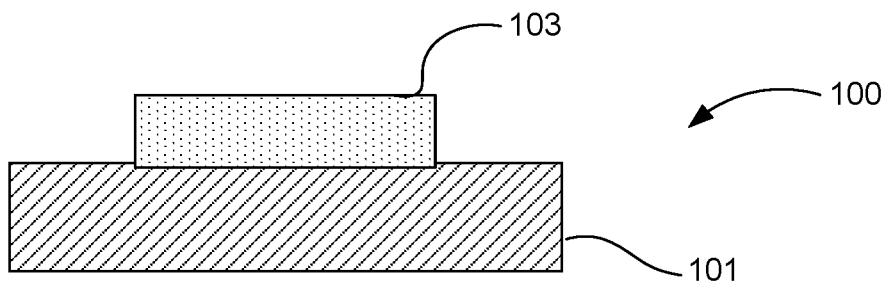
FIGS. 5A-5H illustrate cross-sectional views of an embodiment of the method for fabrication of a package substrate having high-density interconnect bond pads and integral vias, according to some embodiments of the disclosure.

In FIG. 5A, partially assembled package substrate 100 is received. Package substrate 100 comprises first dielectric layer 101 and first metallization structure 103. In some embodiments, first dielectric layer 101 comprises a build-up film laminate. In some embodiments, first dielectric layer 101 comprises a substrate core. In some embodiments, first dielectric layer 101 comprises a rigid Bakelite panel. In some embodiments, first dielectric layer comprises an epoxy resin. In some embodiments, first metallization structure 102 is a bond pad. In some embodiments, first metallization structure 103 is a conductive trace. In some embodiments, first metallization layer comprises a metal such as, but not limited to, copper, aluminum, gold or silver.

Figure 5B:
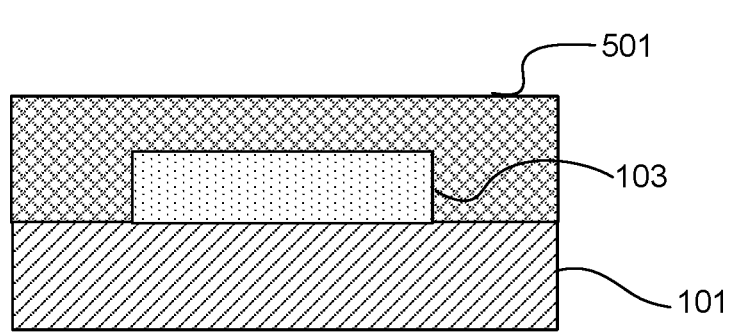

In FIG. 5B, sacrificial layer 501 is laid over first metallization structure 103 and first dielectric layer 101. In some embodiments, sacrificial layer 501 is a photoresist film. In some embodiments, sacrificial layer 501 is a dry film photoresist laminate. In some embodiments, sacrificial layer 501 is formed by spin-coating a liquid photoresist resin, then harden by baking. In some embodiments, sacrificial layer 501 is formed by spray-coating a liquid photoresist resin, then harden by baking. In some embodiments, sacrificial layer 501 comprises a positive photoresist material. In some embodiments, sacrificial layer 501 comprises a negative photoresist material.

Figure 5C:
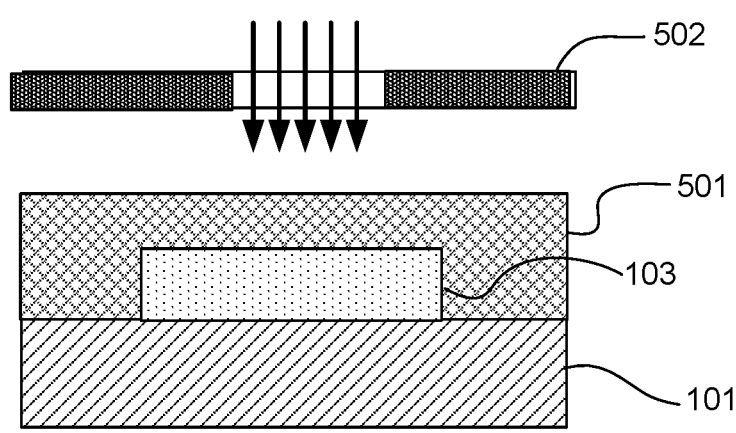

In FIG. 5C, sacrificial layer 501 is lithographically patterned into a metallization template by exposure to light through lithography mask 502. In the illustrated embodiment of FIG. 5C, sacrificial layer 501 is a negative resist, cross-linking (hardening) where exposed to light. In some embodiments, sacrificial layer is a positive photoresist, photodegrading (softening) where exposed to light. For a positive photoresist, the pattern of lithography mask 502 is inverted. After light exposure through lithography mask 502, sacrificial layer 501 is developed into the lithography pattern. In some embodiments, sacrificial layer 501 has a thickness ranging between 10 and 100 microns. The thickness of sacrificial layer 501 determines the z-height of to-be formed integral vias, as shown in FIG. 5H.

Figure 5D:
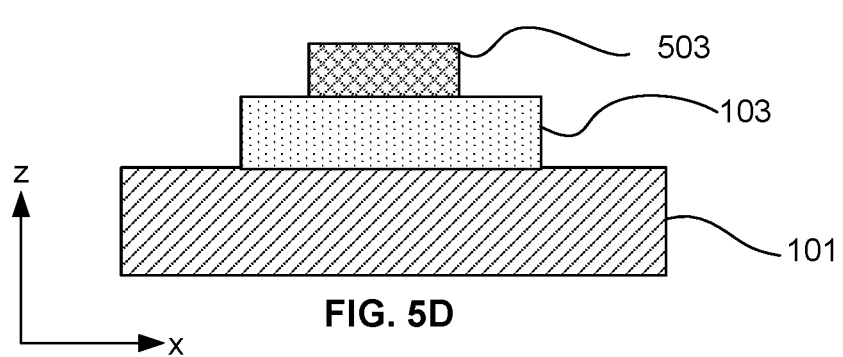

In FIG. 5D, sacrificial structure 503 remains after development of sacrificial layer 501, and partially covers metallization structure 103. In some embodiments, sacrificial structure 503 is a cavity template. In some embodiments, sacrificial structure has a thickness that is substantially the same as sacrificial layer 501. In some embodiments, sacrificial structure 503 is slightly thinner than sacrificial layer 501 due to some chemical attack by a photoresist development process. In some embodiments, sacrificial structure 503 has substantially vertical sidewalls.

Figure 5E:
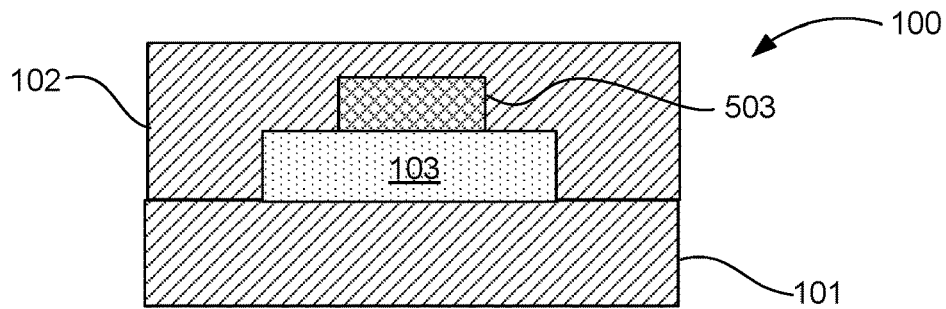

In FIG. 5E, second dielectric layer 102 is formed over metallization structure 103 and sacrificial structure 503. In some embodiments, second dielectric layer 102 is a dielectric build-up film that is laminated over substrate 100. In some embodiments, second dielectric layer 102 is a liquid epoxy resin that is molded on substrate 100. In some embodiments, second dielectric layer 503 encapsulates sacrificial structure 503 and metallization structure 103.

Figure 5F:
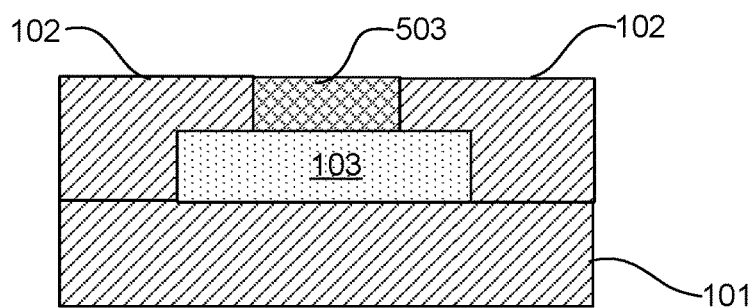

In FIG. 5F, the top of second dielectric layer 102 is planarized to reveal sacrificial structure 503. In some embodiments, planarization of second dielectric layer 102 is performed by a suitable wet chemical etch. In some embodiments, second dielectric layer 102 is planarized by a dry etch. For example, a reactive ion plasma etch may be employed. In some embodiments, second dielectric layer 102 is planarized by chemomechanical polishing (CMP). In some embodiments, the planarization step removes a portion of sacrificial structure 503, determining the z-height of a via formed in subsequent steps.

Figure 5G:
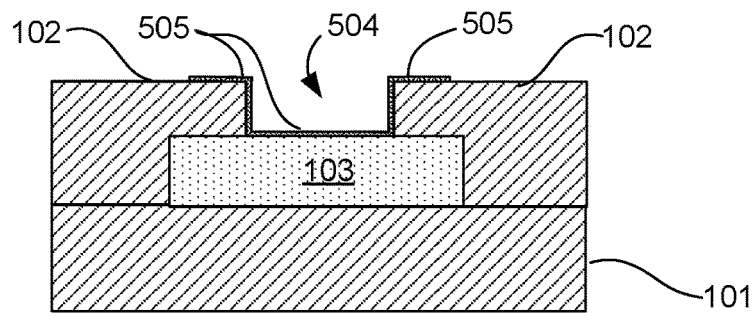
Figure 5H:
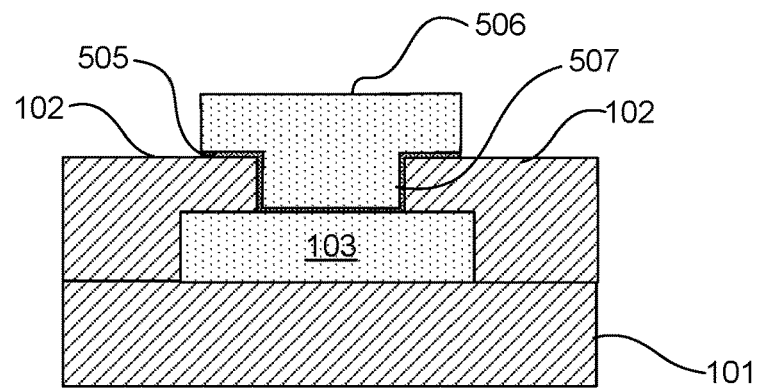
Figure 5H:
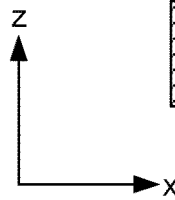

In FIG. 5G, cavity 504 is formed in second dielectric layer 102. Sacrificial structure 503 has been removed in a previous step. In some embodiments, sacrificial structure 503 is stripped by standard photoresist stripping solutions and methods. In some embodiments, cavity 504 has substantially the z-height and x-y dimensions of sacrificial structure 503. In some embodiments, cavity 504 has substantially vertical sidewalls.

After formation of cavity 504, seed layer 505 is deposited over second dielectric layer 102. In some embodiments, seed layer 505 is a thin conductive film. In some embodiments, seed layer 505 is a thin metallic film. In some embodiments, seed layer 505 comprises any of copper, gold, silver, titanium or tungsten. In some embodiments, seed layer 505 is formed by sputter deposition or by vacuum evaporation methods. In some embodiments, seed layer 505 has a thickness ranging from 10 nm to 100 nm.

In some embodiments, seed layer 505 is lithographically patterned to form an electroplating template for plating conductive traces and bond pads. In the illustrated embodiment of FIG. 5G, seed layer 505 is lithographically defined to form the outline of a metallization feature, and extends laterally for a finite distance over the top surface of second dielectric layer 102 in the vicinity of cavity 504. In some embodiments, seed layer 505 is a patterned feature that is to be part of the metallization layer to be formed over the top surface of second dielectric layer 102. In some embodiments, seed layer 505 is a template for a bond pad centered over an integral via that is to be formed in subsequent steps (e.g., FIG. 5H).

In the illustrated embodiment of FIG. 5G, seed layer 505 covers the bottom surface and sidewalls of cavity 504. In some embodiments, seed layer 505 does not extend into cavity 504, and overlays the top surface of second dielectric layer 102 adjacent to cavity 504, as shown in the illustrated embodiment of FIG. 1B. In some embodiments, seed layer 505 overlays at least a portion of the bottom surface of cavity 504 (not shown). In some embodiments, seed layer 505 overlays at least a portion of the bottom surface of cavity 504, and a portion of the sidewalls of cavity 504 (not shown).

In FIG. 5H, second metallization structure 506 and integral via 507 are electroplated into cavity 504. Second metallization structure 506 extends laterally over seed layer 505, and stops at the edge of seed layer 505. In some embodiments, second metallization structure 506 has a shape outline that is substantially the same as that of the patterned seed layer 504. In some embodiments, second metallization structure 506 is a bond pad. In some embodiments, second metallization structure is a conductive trace. In some embodiments, second metallization structure comprises at least one of copper, aluminum, gold, silver, nickel or cobalt. In some embodiments, second metallization structure has a thickness ranging from 1 micron to 50 microns.

Integral via 507 is formed by electroplating into cavity 504 (FIG. 5G). In the illustrated embodiment of FIG. 5H, integral via 507 is formed over seed layer 505, lining the bottom and sidewalls of integral via 507. Here, seed layer 505 intervenes between first metallization structure 103 and integral via 507. In some embodiments, seed layer 505 merely overlays second dielectric layer 102. Here, the bottom of integral via 507 forms a direct interface with first metallization structure 103, having no intervening layer in between. In some embodiments, an abrupt internal metallurgical demarcation exists between first metallization structure 103 and integral via 507. The demarcation is visible in cross-sectional micrographs of the interfacial region. In some embodiments, the demarcation is formed by metal grain boundaries confined to either side of the interface between integral via 507 and first metallization structure 102 (illustrated in FIG. 2).

In some embodiments, integral via 507 has substantially vertical sidewalls. In some embodiments, integral via 507 comprises the same material as second metallization structure 506. In some embodiments, integral via comprises at least one of copper, aluminum, gold, silver, nickel or cobalt.

In some embodiments, the formation of integral via 507 is initiated by nucleation directly on the exposed portion of first metallization layer 103. In some embodiments, the formation of integral via 507 is initiated by nucleation on seed layer 505 on the bottom or sidewalls of cavity 504 (not shown). Metal surfaces within cavity 504, including the exposed area of first metallization structure 103, serve as a cathode microelectrode. Growth of integral via 507 within cavity 504 is carried on by continuous electroplating the metal into cavity 504 in a suitable plating bath. In some embodiments, seed layer 505 is coupled to a power source, such as a potentiostat, and electrified simultaneously with first metallization structure 103.

Thus, electroplating is performed on seed layer 505 that is over the top of second dielectric layer 102, forming second metallization structure 506 simultaneously with electroplating into cavity 504 to form integral via 507. In some embodiments, the portions of seed layer 505 that overlay the surface of second dielectric layer 102 serve as a large area cathode, substantially increasing the plating surface in relation to the pinhole electrodes only. In this manner, the problems associated with high current densities in the pinhole electrode within cavity 504 are prevented from occurring. As a consequence, uniform plating thickness across the substrate surface is promoted.

In some embodiments, growth of integral via 507 and second metallization structure 506 occur simultaneously. As the z-height of integral via 507 increases, it reaches the surface of second dielectric 102 and begins to mushroom laterally. In some embodiments, integral via 507 makes contact with seed layer 505 and growing second metallization structure 506. In some embodiments, integral via 507 continues to grow vertically to reach a z-height that is substantially the same as second metallization structure 506. In some embodiments, the z-height of second metallization structure 506 is larger than that of integral via 507. In some embodiments, integral via 507 is contiguous with second metallization structure 506.

In some embodiments, metal grains extend through the interfacial region between integral via 507 and second metallization structure 506, as a result of simultaneous electroplating of the two structures (shown in FIG. 2). In some embodiments, integral via 507 is metallurgically contiguous with second metallization structure 506.

FIGS. 6A-6F illustrate cross-sectional views of an embodiment of the method for fabrication of vertically integrated package substrate 400 having an embedded multichip bridge interconnect (EMIB) and IC die coupled to the EMIB through a via and bond pad, according to some embodiments of the disclosure.

Figure 6A:
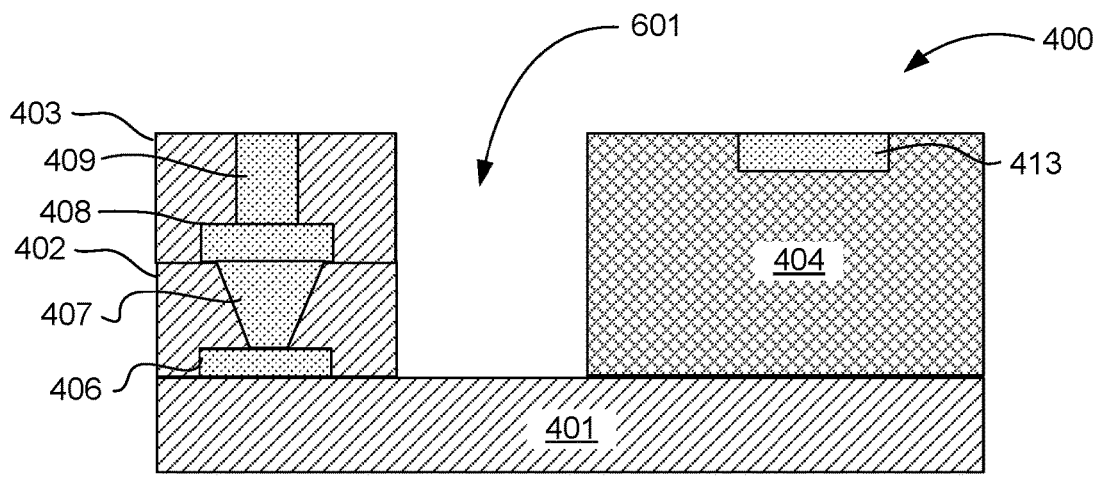
FIG. 6A-6F illustrate cross-sectional views of an embodiment of the method for fabrication of vertically integrated package substrate 400 having an embedded multichip bridge interconnect (EMIB) and IC die coupled to the EMIB through a via and bond pad, according to some embodiments of the disclosure.

In FIG. 6A, partially assembled vertically integrated package substrate 400 is received comprising first dielectric layer 401, partially overlaid by second dielectric layer 402 and third dielectric layer 403. Embedded in second dielectric layer 402 is first metallization structure 406 and via 407. Embedded in third dielectric layer 403 is second metallization structure 408 and via 409. First dielectric layer 401 also is overlaid by embedded multichip interconnect bridge (EMIB) 404, having EMIB bond pad 413 on the top surface of EMIB 404. In some embodiments, gap 601 intervenes between the edges of second dielectric layer 402 and third dielectric layer 403 and EMIB 404.

Figure 6B:
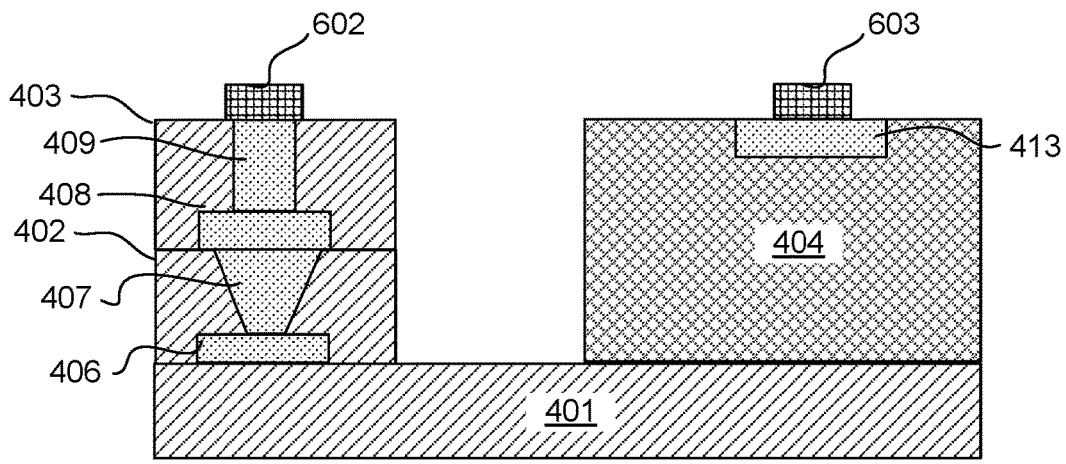

In FIG. 6B, sacrificial structure 602 is formed by previous lithographic steps over the top of via 409. In some embodiments, sacrificial structure 602 extends over the surface of third dielectric 403. Sacrificial structure 603 is formed over EMIB bond pad 413. In some embodiments, sacrificial structures 602 and 603 are lithographically defined, and formed by a process similar to the formation of sacrificial structure 503 in FIG. 5D. Details of the formation of sacrificial structure 503 described for FIG. 5D may apply to formation of sacrificial structures 602 and 603.

Figure 6C:
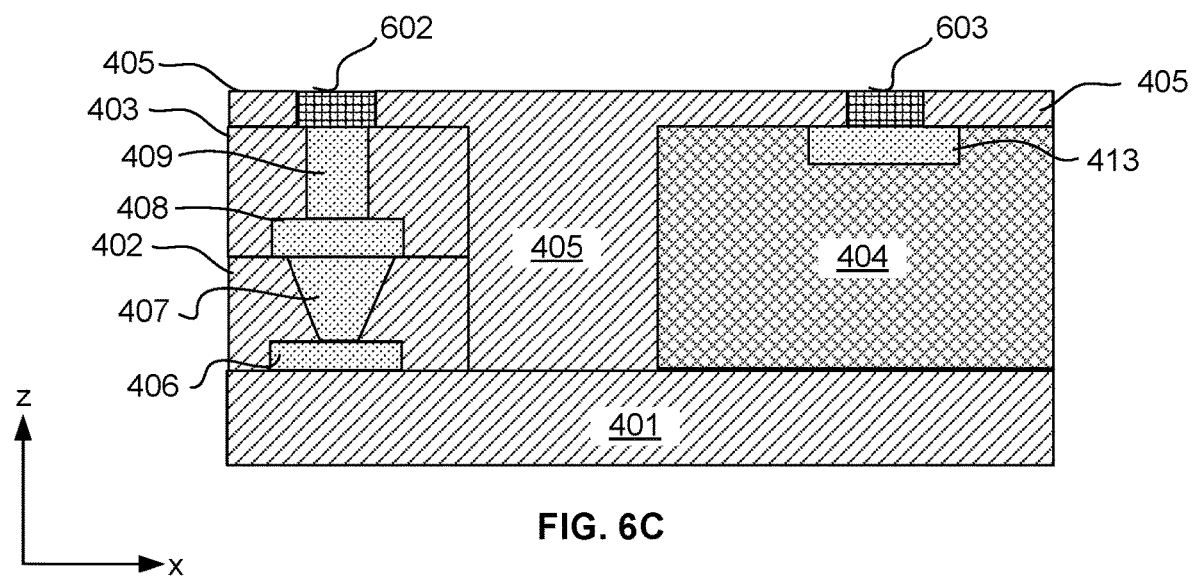

In FIG. 6C, fourth dielectric layer 405 is formed over third dielectric layer 403 and EMIB 404, filling intervening gap 601 (not shown), according to some embodiments. In some embodiments, fourth dielectric layer 405 is a build-up dielectric film and is laminated over vertically integrated substrate 400, encapsulating second and third dielectric layers 402 and 403, respectively, EMIB 404, and sacrificial structures 602 and 603. In some embodiments, fourth dielectric layer 405 is a liquid dielectric that is molded over vertically integrated substrate 400.

In some embodiments, fourth dielectric layer 405 is planarized or back etched in a previous process step to expose sacrificial structures 602 and 603. Planarization may be performed by a number of suitable methods. In some embodiments, fourth dielectric layer 405 is planarized by a wet chemical etch. In some embodiments, fourth dielectric layer is planarized by a dry plasma etch, for example, a deep reactive ion etch (DRIE). In some embodiments, fourth dielectric layer 405 is planarized by chemomechanical polishing (CMP).

Figure 6D:
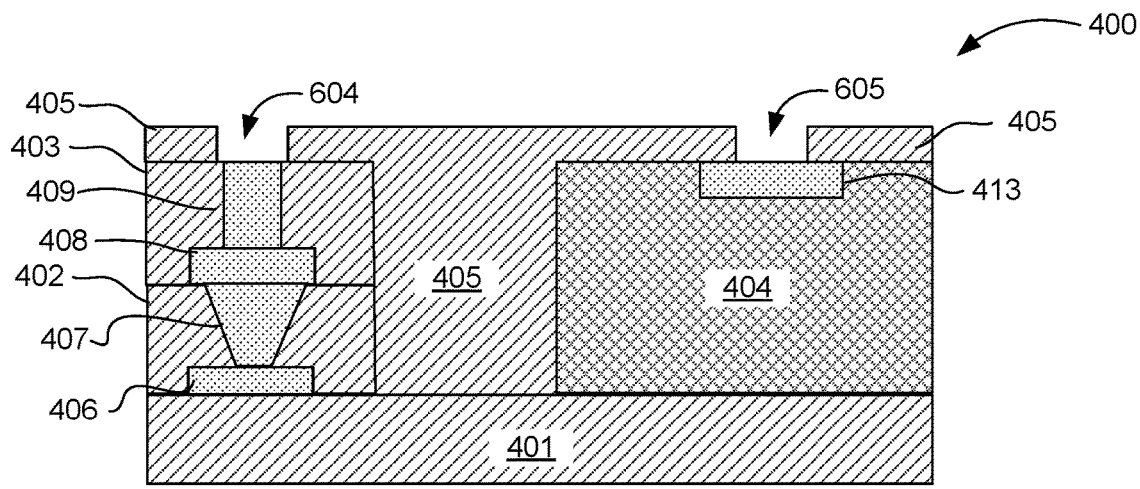

In FIG. 6D, sacrificial structures 602 and 603 (not shown) are removed in a previous step. In some embodiments, a process similar or the same as described for FIG. 5G is employed. Open cavities 604 and 605 are formed in fourth dielectric layer 405, exposing the tops of via 409 and EMIB bond pad 413. In some embodiments, sacrificial structures are removed by a photoresist strip.

Figure 6E:
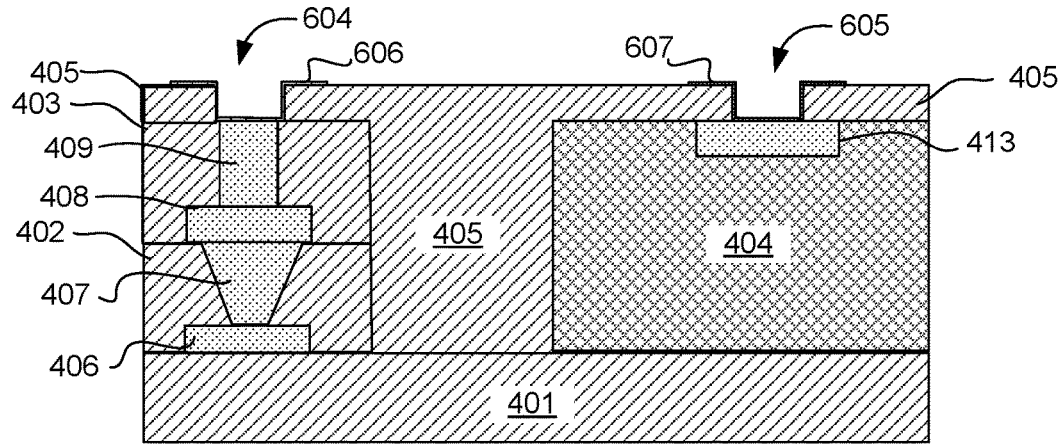

In FIG. 6E, patterned seed layers 606 and 607 are formed in previous steps. In some embodiments, a process similar or the same as described for deposition of seed layers 606 and 607 (see FIG. 5G) is employed to form seed layers 606 and 607. In some embodiments, seed layers 606 and 607 extend into open cavities 604 and 605, respectively, overlaying the sidewalls and bottoms of cavities 604 and 605. In some embodiments, seed layers 606 and 607 overlay the top surface of fourth dielectric layer 405.

Figure 6F:
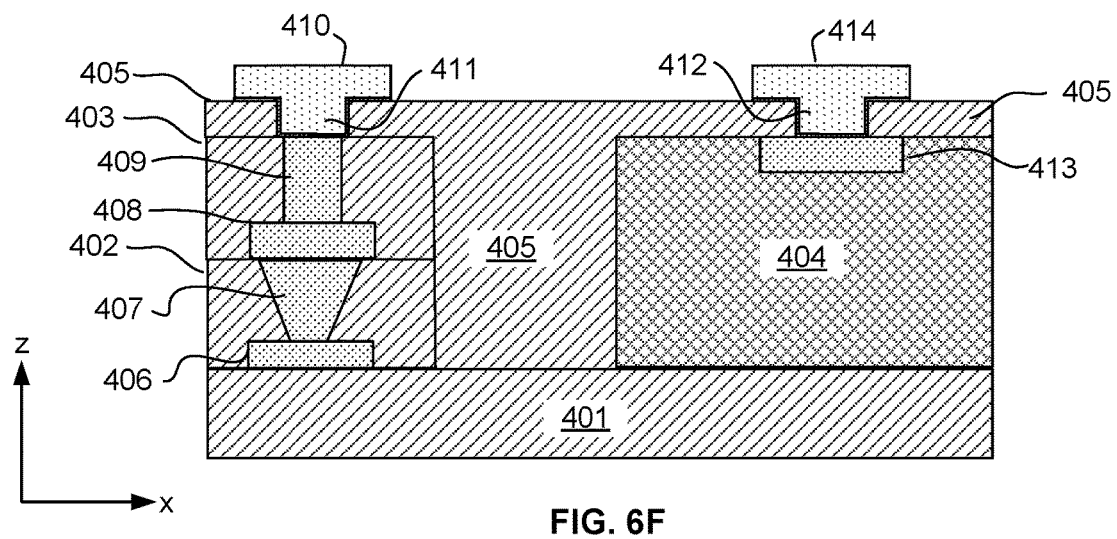

In FIG. 6F, top level bond pads 410 and 414, as well as integral vias 411 and 412, are formed by electrodeposition. In some embodiments, an electrodeposition process similar to or the same as that described for FIG. 5H is employed to form integral vias 411 and 412, as well as top level bond pads 410 and 414. In some embodiments, top level bond pads 410 and 414 are part of a high-density bond pad array for bonding high-density interconnect dies. In some embodiments, the high-density bond pad array has a center-to-center pitch of less than 30 microns.

Figure 7:
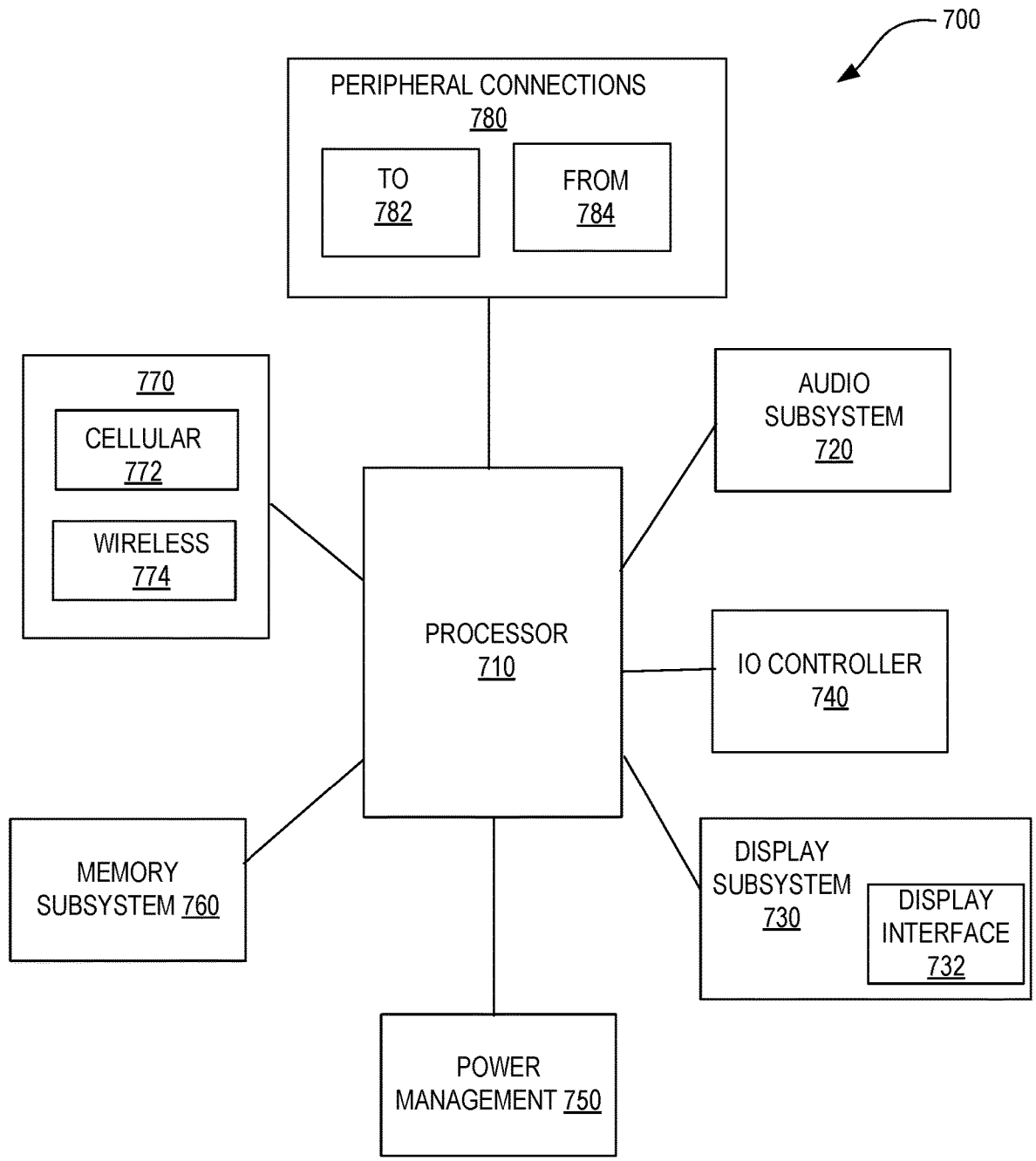
FIG. 7 illustrates a vertically integrated IC package substrate, fabricated according to the disclosed method, as part of a system-on-chip (SoC) package in an implementation of computing device, according to some embodiments of the disclosure.

FIG. 7 illustrates a vertically integrated IC package substrate (100 or 400), fabricated according to the disclosed method, as part of a system-on-chip (SoC) package in an implementation of computing device, according to some embodiments of the disclosure.

FIG. 7 illustrates a block diagram of an embodiment of a mobile device in which flat surface interface connectors could be used. In some embodiments, computing device 700 represents a mobile computing device, such as a computing tablet, a mobile phone or smart-phone, a wireless-enabled e-reader, or other wireless mobile device. It will be understood that certain components are shown generally, and not all components of such a device are shown in computing device 700.

In some embodiments, computing device 700 includes a first processor 710. The various embodiments of the present disclosure may also comprise a network interface within 770 such as a wireless interface so that a system embodiment may be incorporated into a wireless device, for example, cell phone or personal digital assistant.

In one embodiment, processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O and/or display I/O.

In one embodiment, computing device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 700, or connected to the computing device 700. In one embodiment, a user interacts with the computing device 700 by providing audio commands that are received and processed by processor 710.

Display subsystem 730 represents hardware (e.g., display devices) and software (e.g., drivers) components that provide a visual and/or tactile display for a user to interact with the computing device 700. Display subsystem 730 includes display interface 732 which includes the particular screen or hardware device used to provide a display to a user. In one embodiment, display interface 732 includes logic separate from processor 710 to perform at least some processing related to the display. In one embodiment, display subsystem 730 includes a touch screen (or touch pad) device that provides both output and input to a user.

I/O controller 740 represents hardware devices and software components related to interaction with a user. I/O controller 740 is operable to manage hardware that is part of audio subsystem 720 and/or display subsystem 730. Additionally, I/O controller 740 illustrates a connection point for additional devices that connect to computing device 700 through which a user might interact with the system. For example, devices that can be attached to the computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of the computing device 700. Additionally, audio output can be provided instead of, or in addition to display output. In another example, if display subsystem 730 includes a touch screen, the display device also acts as an input device, which can be at least partially managed by I/O controller 740. There can also be additional buttons or switches on the computing device 700 to provide I/O functions managed by I/O controller 740.

In one embodiment, I/O controller 740 manages devices such as accelerometers, cameras, light sensors or other environmental sensors, or other hardware that can be included in the computing device 700. The input can be part of direct user interaction, as well as providing environmental input to the system to influence its operations (such as filtering for noise, adjusting displays for brightness detection, applying a flash for a camera, or other features).

In one embodiment, computing device 700 includes power management 750 that manages battery power usage, charging of the battery, and features related to power saving operation. Memory subsystem 760 includes memory devices for storing information in computing device 700. Memory can include nonvolatile (state does not change if power to the memory device is interrupted) and/or volatile (state is indeterminate if power to the memory device is interrupted) memory devices. Memory subsystem 760 can store application data, user data, music, photos, documents, or other data, as well as system data (whether long-term or temporary) related to the execution of the applications and functions of the computing device 700.

Elements of embodiments are also provided as a machine-readable medium (e.g., memory 760) for storing the computer-executable instructions. The machine-readable medium (e.g., memory 760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 770 includes hardware devices (e.g., wireless and/or wired connectors and communication hardware) and software components (e.g., drivers, protocol stacks) to enable the computing device 700 to communicate with external devices. The computing device

700 could be separate devices, such as other computing devices, wireless access points or base stations, as well as peripherals such as headsets, printers, or other devices.

Network interface 770 can include multiple different types of connectivity. To generalize, the computing device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 780 include hardware interfaces and connectors, as well as software components (e.g., drivers, protocol stacks) to make peripheral connections. It will be understood that the computing device 700 could both be a peripheral device ("to" 782) to other computing devices, as well as have peripheral devices ("from" 784) connected to it. The computing device 700 commonly has a "docking" connector to connect to other computing devices for purposes such as managing (e.g., downloading and/or uploading, changing, synchronizing) content on computing device 700. Additionally, a docking connector can allow computing device 700 to connect to certain peripherals that allow the computing device 700 to control content output, for example, to audiovisual or other systems.

In addition to a proprietary docking connector or other proprietary connection hardware, the computing device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising a substrate comprising a dielectric, a conductor, comprising a via embedded within the dielectric, the via has a first end and a second end, and substantially vertical sidewalls between the first end and the second end; and a conductive structure extending laterally from the first end of the via over the dielectric, wherein the via and the conductive structure have a contiguous microstructure.

Example 2 includes all of the features of example 1, wherein the conductor comprises a polycrystalline metal.

Example 3 includes all of the features of example 2, wherein metal grains of the polycrystalline metal have a substantially uniform distribution extending from the via into the conductive structure of the conductor.

Example 4 includes all of the features of examples 2 or 3, wherein the grains of the polycrystalline metal extend between the via and the conductive structure.

Example 5 includes all of the features of any one of examples 1 through 4, wherein the sidewalls of the via are substantially vertical.

Example 6 includes all of the features of any one of examples 1 through 5, wherein the conductive structure is a first metal structure, and wherein a second metal structure is disposed between the first metal structure and the dielectric.

Example 7 includes all of the features of any one of example 6, wherein the second metal structure comprises titanium.

Example 8 includes all of the features of example 6, wherein the second metal structure comprises palladium.

Example 9 includes all of the features of any one of examples 1 through 8, wherein the via is a first via, and wherein the second end of the via is disposed over a second via.

Example 10 includes all of the features of any one of examples 1 through 9, wherein the conductive structure is a first conductive structure, and wherein the second end of the via portion is disposed over a second conductive structure.

Example 11 includes all of the features of any one of examples 1 through 10, wherein the conductor comprises any one of copper or nickel.

Example 12 is a system, comprising a processor, a memory, wherein the processor is coupled to the memory, and an integrated circuit (IC) package, comprising a substrate comprising a dielectric, a conductor, comprising a via embedded within the dielectric, the via has a first end and a second end, and substantially vertical sidewalls between the first end and the second end, and a conductive structure extending laterally from the first end of the via over the dielectric, wherein the via and the conductive structure have a contiguous microstructure, and a wireless interface coupled to the processor to allow the processor to communicatively couple to an external device.

Example 13 includes all of the features of example 12, wherein the IC package further comprise an embedded multichip interconnect bridge.

Example 14 includes all of the features of examples 12 or 13, wherein the conductor comprises a polycrystalline metal having a substantially uniform distribution of metal grains extending from the via portion into the conductive structure portion of the conductor.

Example 15 includes all of the features of any one of examples 12 through 14, wherein the conductive structure is a first structure, and a second structure is disposed between the first structure and the dielectric.

Example 16 includes all of the features of any one of examples 13 through 15, wherein the conductor is coupled to the embedded multichip interconnect bridge.

Example 17 is a method, comprising forming a substrate comprising a first dielectric and a first metal structure over the first dielectric, depositing a sacrificial structure over the first metal structure and the first dielectric, patterning the sacrificial structure to create one or more islands of sacrificial structure over the first metal structure, depositing a second dielectric over the substrate comprising the one or more islands of sacrificial structure over the first metal structure, creating openings in the second dielectric to expose the one or more islands of sacrificial structure, removing the one or more islands of sacrificial structure to create openings in the second dielectric and expose regions of the first metal structure, depositing a seed structure over the second dielectric adjacent to the openings; and depositing a metal into the openings in the second dielectric to create vias, and on the seed structure adjacent to the openings to create a second metal structure extending from the vias over the second dielectric.

Example 18 includes all of the features of example 17, wherein depositing a sacrificial structure over the first metal structure and the first dielectric comprises depositing a photoresist over the first metal structure and the first dielectric.

Example 19 includes all of the features of examples 17 or 18, wherein depositing a sacrificial structure over the first metal structure and the first dielectric comprises laminating a dry film resist over the first metal structure and the first dielectric.

Example 20 includes all of the features of any one of examples 17 through 19, wherein creating openings in the second dielectric to expose the one or more islands of sacrificial structure comprises etching the second dielectric to reveal the one or more islands of sacrificial structure.

Example 21 includes all of the features of any one of the examples 17 through 20, wherein creating openings in the second dielectric to expose the one or more islands of sacrificial structure comprises chemomechanical polishing the second dielectric.

Example 22 includes all of the features of any one of the examples 17 through 20, wherein creating openings in the second dielectric to expose the one or more islands of sacrificial structure comprises plasma etching the second dielectric.

Example 23 includes all of the features of any one of examples 17 through 22, wherein depositing a seed structure over the second dielectric comprises sputtering a conductive film over the second dielectric.

Example 24 includes all of the features of any one of examples 17 through 23, wherein depositing a seed structure over the second dielectric comprises electroless deposition of a conductive film over the second dielectric.

Example 25 includes all of the features of examples 23 or 34, wherein the conductive film comprises any one of titanium and palladium.

Example 26 includes all of the features of any one of examples 17 through 25, wherein depositing a metal into the openings in the second dielectric to create vias, and on the seed structure adjacent to the openings to create a second metal structure extending from the vias over the second dielectric comprises electroplating a metal into the openings in the first and second dielectrics and on the seed structure adjacent to the openings.

Example 27 includes all of the features of any one of examples 17 through 26, wherein the vias couple the first metal structures to the second metal structure.

Example 28 includes all of the features of any one of examples 17 through 27, wherein depositing a metal into the openings in the second dielectric to create vias, and on the seed structure adjacent to the openings to create a second metal structure extending from the vias over the second dielectric comprises forming a contiguous structure comprising the vias and the second metal structure, and wherein the microstructure of the vias is contiguous with the microstructure of the second metal structure.

Example 29 includes all of the features of any one of examples 17 through 28, wherein patterning the sacrificial structure to create one or more islands of sacrificial structure over the first metal structure comprises creating one or more islands of sacrificial structure having substantially vertical sidewalls.

Example 30 includes all of the features of any one of examples 17 through 29, wherein depositing a second dielectric over the substrate comprising the one or more islands of sacrificial structure over the first metal structure comprises laminating a film of the second dielectric over the substrate comprising the one or more islands of sacrificial structure over the first metal structure.

Example 31 includes all of the features of any one of examples 17 through 29, wherein depositing a second dielectric over the substrate comprising the one or more islands of sacrificial structure over the first metal structure comprises spin coating a film of the second dielectric over the substrate comprising the one or more islands of sacrificial structure over the first metal structure.

Example 32 includes all of the features of any one of examples 17 through 29, wherein depositing a second dielectric over the substrate comprising the one or more islands of sacrificial structure over the first metal structure comprises spray coating a film of the second dielectric over the substrate comprising the one or more islands of sacrificial structure over the first metal structure.

Example 33 includes all of the features of any one of examples 17 through 32, wherein depositing a second dielectric over the substrate comprising the one or more islands of sacrificial structure over the first metal structure comprises conformally depositing the second dielectric over the substrate comprising the one or more islands of sacrificial structure over the first metal structure.

Example 34 includes all of the features of any one of examples 17 through 33, wherein removing the one or more islands of sacrificial structure to create openings in the second dielectric and expose regions of the first metal structure comprises creating openings having substantially vertical sidewalls.

Example 35 includes all of the features of any one of examples 17 through 34, further comprising patterning the second metal structure to create conductive structures over the second dielectric.

Example 36 includes all of the features of any one of examples 17 through 35, wherein patterning the second metal structure to create conductive structures over the second dielectric comprises creating metal traces on the second dielectric.

Example 37 includes all of the features of any one of examples 17 through 36, wherein patterning the second metal structure to create conductive structures over the second dielectric comprises creating metal pads on the second dielectric.

Example 38 includes all of the features of any one of examples 17 through 37, wherein the vias couple the first metal structure to the conductive structures over the second dielectric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An integrated circuit (IC) package, comprising:
   a level of metallization structures spaced apart within an area of the package;
   a dielectric material over the level of metallization structures, wherein a first of the level of metallization structures comprises a bond pad on an embedded multichip interconnect bridge (EMIB) embedded within the dielectric material;
   a plurality of first bond pad structures within the area of the package, wherein each of the first bond pad structures extends over a portion of the dielectric material, and comprises an integral via that is adjacent to a sidewall of the dielectric material and is in contact with a corresponding one of the level of metallization structures;
   an IC die comprising a plurality of second bond pad structures within an area of the IC die; and
   a plurality of interconnect structures that couple the first bond pad structures to the second bond pad structures.

2. The IC package of claim 1, wherein individual ones of the first bond pad structures have a contiguous microstructure extending into the integral via.

3. The IC package of claim 1, wherein individual ones of the first bond pad structures comprise a polycrystalline metal with one or more grains extending into the integral via.

4. The IC package of claim 1, wherein the dielectric material is a first dielectric material, and the level of metallization structures comprises a second via embedded within a second dielectric material embedded below the dielectric material.

5. The IC package of claim 4, wherein the second via is coupled to a metal trace in a second level of metallization structures adjacent to the EMIB.

6. The IC package of claim 1, wherein the integral via comprises a seed layer material in contact with the corresponding one of the metallization structures.

7. The IC package of claim 6, wherein the seed layer material lines the sidewall of the dielectric material and extends over the dielectric material.

8. The IC package of claim 7, wherein the integral via further comprises a second material in contact with the seed layer material, and the seed layer material has a different composition than the second material, and wherein a top surface of the bond pad structures comprises the second material.

9. The IC package of claim 1, wherein a center-to-center pitch of the first bond pad structures is less than 30 microns.

10. A system comprising:
    an integrated circuit (IC) package comprising:
    an embedded multichip interconnect bridge (EMIB);
    a plurality of levels of package metallization structures adjacent to the EMIB, and embedded within a first package dielectric material;
    a second package dielectric material over the first package dielectric material and the levels of package metallization structures, and over the EMIB;
    a plurality of first bond pad structures, wherein each of the first bond pad structures extends over a portion of the second package dielectric material, and comprises an integral via that is adjacent to a sidewall of the second package dielectric material, and wherein a first of the first bond pad structures is in contact with a top level of the package metallization structures, and wherein a second of the first bond pad structures is in contact with a metallization structure of the EMIB;
    an IC die comprising a plurality of second bond pad structures; and
    a plurality of interconnect structures that couple the first bond pad structures to the second bond pad structures.

11. The system of claim 10, wherein the IC die comprises a processor and wherein the system further comprises a memory.

12. The system of claim 11, wherein the memory also coupled to the EMIB.

13. The system of claim 11, further comprises a wireless interface coupled to the processor to allow the processor to communicatively couple to a device external to the system.

14. The system of claim 11, wherein individual ones of the first bond pad structures comprise a polycrystalline metal with one or more grains extending into the integral via.

15. The system of claim 11, wherein the top level of the package metallization structures comprises a second via embedded within the first package dielectric material, and wherein the integral via is in direct contact with the second via.

16. The system of claim 15, wherein the integral via comprises a seed layer material in contact with the second via.

17. The system of claim 16, wherein the seed layer material lines the sidewall of the second package dielectric material and extends over the second package dielectric material.

18. The system of claim 10, wherein individual ones of the first bond pad structures have a contiguous microstructure extending into the integral via.

19. The system of claim 10, wherein the sidewall of the second package dielectric material adjacent to the integral via is substantially vertical.

* * * * *